United States Patent
Gao et al.

(10) Patent No.: US 9,362,211 B1
(45) Date of Patent: Jun. 7, 2016

(54) EXPOSED PAD INTEGRATED CIRCUIT PACKAGE WITH MOLD LOCK

(71) Applicant: FREESCALE SEMICONDUCTOR, INC., Austin, TX (US)

(72) Inventors: Wei Gao, Tianjin (CN); Zhiwei Gong, Chandler, AZ (US); Yanting Tian, Tianjin (CN); Jinzhong Yao, Tianjin (CN); Dehong Ye, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/929,381

(22) Filed: Nov. 1, 2015

(30) Foreign Application Priority Data

May 5, 2015 (CN) .......................... 2015 1 0371780

(51) Int. Cl.
*H01L 23/495* (2006.01)
*H01L 23/31* (2006.01)

(52) U.S. Cl.
CPC ...... *H01L 23/49503* (2013.01); *H01L 23/3107* (2013.01); *H01L 23/49541* (2013.01)

(58) Field of Classification Search
None
See application file for complete search history.

(56) References Cited

U.S. PATENT DOCUMENTS

| | | | |
|---|---|---|---|
| 4,862,246 A * | 8/1989 | Masuda | H01L 21/4828 174/536 |
| 6,326,678 B1 | 12/2001 | Karnezos et al. | |
| 6,468,832 B1 * | 10/2002 | Mostafazadeh | H01L 21/565 257/738 |
| 6,498,099 B1 * | 12/2002 | McLellan | H01L 23/3107 257/E23.043 |
| 6,876,068 B1 * | 4/2005 | Lee | H01L 23/3107 257/666 |
| 6,984,878 B2 | 1/2006 | Park et al. | |
| 7,078,271 B2 | 7/2006 | Mahle | |
| 7,217,599 B2 | 5/2007 | Punzalan et al. | |
| 7,262,491 B2 * | 8/2007 | Islam | H01L 23/3107 257/676 |
| 7,476,959 B2 * | 1/2009 | St. Germain | H01L 23/3107 257/676 |
| 7,732,901 B2 * | 6/2010 | Camacho | H01L 24/49 257/676 |
| 7,741,161 B2 * | 6/2010 | Khor | H01L 23/3107 438/124 |
| 7,781,899 B2 | 8/2010 | Sim et al. | |
| 7,834,431 B2 | 11/2010 | Hooper et al. | |
| 8,102,037 B2 * | 1/2012 | Lee | H01L 23/3107 257/666 |
| 8,536,688 B2 * | 9/2013 | Ahn | H01L 23/49503 257/666 |
| 8,742,555 B2 | 6/2014 | Wen et al. | |
| 2002/0180018 A1 | 12/2002 | Shermer | |
| 2004/0124505 A1 | 7/2004 | Mahle et al. | |
| 2005/0260795 A1 * | 11/2005 | Park | H01L 23/49503 438/111 |
| 2008/0067660 A1 * | 3/2008 | Kim | H01L 23/3128 257/686 |
| 2011/0266662 A1 * | 11/2011 | Hsia | H01L 23/3107 257/676 |
| 2013/0334674 A1 * | 12/2013 | Zheng | H01L 21/4832 257/676 |

* cited by examiner

*Primary Examiner* — Scott B Geyer
(74) *Attorney, Agent, or Firm* — Charles E. Bergere

(57) ABSTRACT

An integrated circuit package has an exposed die pad with a trench and openings in the trench that are filled with encapsulant to form an encapsulant ring near the edges of the die pad. During assembly, the encapsulant passes through the openings and fills the trench to form the encapsulant ring. The ring helps to keep the die pad from separating from the encapsulant caused by thermal cycling. Air vents might be included in the die pad surface to allow air to escape from the trenches and the openings as they fill with encapsulant. Trenches from the openings to the die pad edge on the chip-side of the die pad might be included to increase adhesion of the encapsulant to the die pad.

19 Claims, 3 Drawing Sheets

EXPOSED PAD INTEGRATED CIRCUIT PACKAGE WITH MOLD LOCK

BACKGROUND OF THE INVENTION

The present invention relates generally to integrated circuit packaging and, more particularly, to lead frame with a mold locking feature formed in the die pad.

Generally, one or more integrated circuits (ICs) or "dies" are packaged in a way that allows the circuits to be used in larger systems and to protect the dies from environmental damage. Often, a lead frame is used to provide electrical interconnection between IO pads of the die with IO pads of external systems, e.g., a printed circuit board (PCB). A lead frame thus includes metal leads (used to couple signals in and out of the integrated circuit package) and possibly other elements such as power bars and die paddles (also known as die pads and die flags). Prior to assembly, the lead frame may have support structures (e.g., a metal frame and tie bars) that keep the leads and die pad in place. During the assembly process, the support structures may be removed. As used herein, the term "lead frame" may be used to refer to the collection of elements before or after assembly, regardless of the presence or absence of the support structures.

Within the IC package are bond wires that electrically connect bond pads on the die to the metal leads of the lead frame. The die, die pad, bond wires, and a portion of the leads are embedded in a non-conductive, rigid, and impervious encapsulant to protect the die, bond wires and interconnections from environmental contaminants such as water. The leads have an exposed portion outside of the package that allows for electrical interconnections between the packaged chip and external circuitry on, for example, a PCB or the like. Typical encapsulants are plastics such as epoxy, and the lead frame is typically made of copper or a copper alloy. The bond wires are usually made of gold, aluminum, copper, or a copper alloy.

Power integrated circuits, such as voltage regulators or power amplifiers, have field-effect transistors (MOSFET) or bipolar transistors that operate to variably couple current to a load. As a consequence of conducting current, the transistors generate heat that warms the chip as a whole, whereby the integrated circuit can be damaged if the temperature of the chip gets too high. One technique for cooling the chip is to configure the encapsulant so that one side of the die pad is exposed while leaving the other side (the side having the chip attached thereto) embedded in the encapsulant. This allows the die pad to be attached to a heat sink that extracts heat from the chip and out of the package.

As the packaged chip heats up and cools over time (thermally cycles), such as when it is soldered to a PCB and during normal operation of the chip, the encapsulant and the die pad can separate from each other since the thermal coefficient of expansion (CTE) of the mold compound (plastic) is different from that of the die pad (metal). This might cause the packaged device to fail if contaminants, such as moisture, enter the package along the separations. Accordingly, it would be advantageous to have a package design that resists separation of the mold compound from the die pad.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not been drawn to scale. For example, the thicknesses of layers and sizes of regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

One embodiment of the invention is an article of manufacture comprising a die pad having first and second surfaces, a trench formed in the first surface, and a plurality of openings formed in the trench. The trench is proximate to at least one edge of the die pad and has a longitudinal axis substantially parallel to the at least one edge of the die pad.

Figure 1:
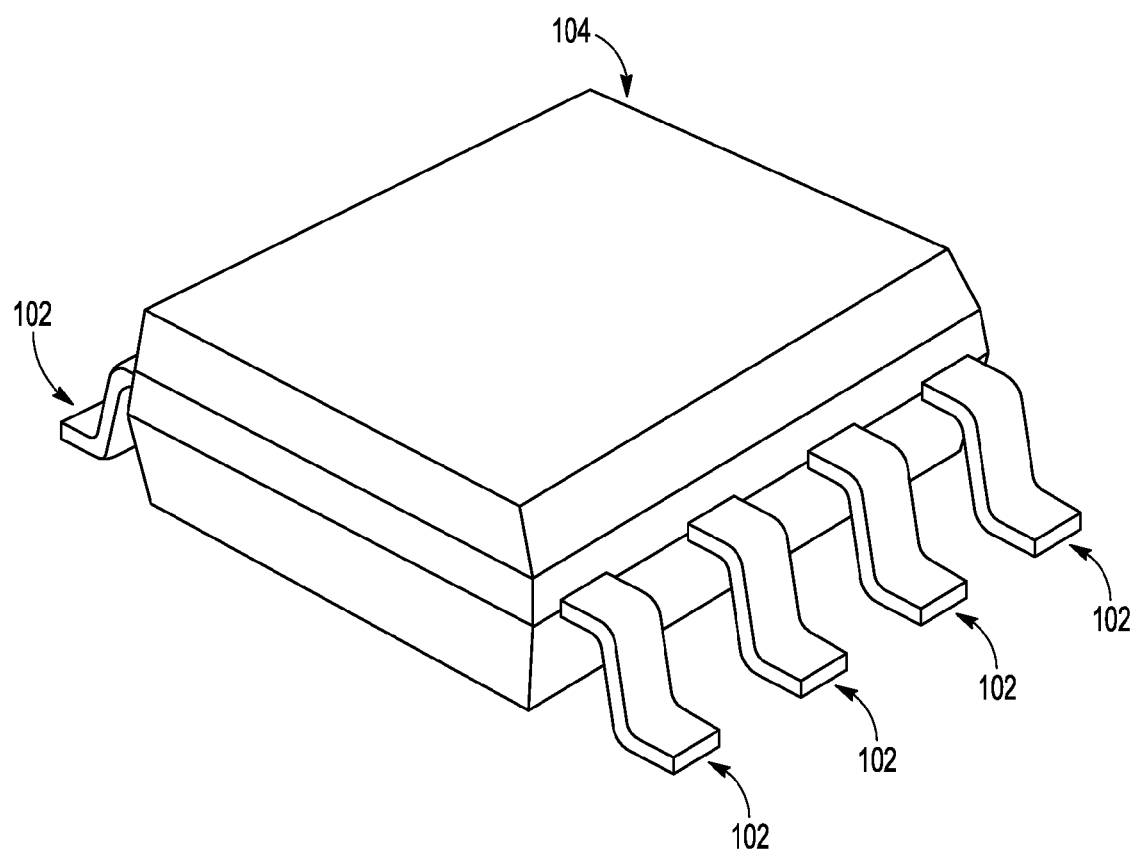
FIG. 1 is an isometric view of an exemplary integrated circuit package in accordance with various embodiments of the present invention.

Referring now to FIG. 1, an isometric view of an eight-pin small outline integrated circuit (SOIC) or chip package 100 for power applications, such as a voltage regulator, a power amplifier, a motor controller, or the like, where high currents or voltages are applied to a load, is shown.

The package 100 comprises an integrated circuit (not shown) of a semiconductor material such as silicon, gallium arsenide, etc., in which transistors, diodes, and other devices or components, active or passive, are formed. Coupled to the integrated circuit are one or more metal conductors or leads 102 for interconnecting the components in the integrated circuit to external circuitry (not shown). In a typical integrated circuit package, the metal leads are part of a conventional lead frame (not shown) formed from metal such as copper or a metal alloy. The lead frame is used to keep the metal parts thereof in a fixed relationship until after encapsulation. Then the lead frame is singulated to remove the unnecessary frame elements (e.g., dam bar, tie bar, etc.) and separate the package from adjacent, simultaneously formed packages, leaving the leads 102 as shown. It is noted that the embodiments shown herein are not limited to SOIC packages, but can be implemented in other package types, such as (without limitation), quad flat no lead (QFN) packages, power quad flat no lead (PQFN), quad flat pack (QFP), or other molded packages where an exposed pad may be used to dissipate heat generated by the integrated circuit.

In this embodiment, a conventional integrated circuit (not shown) is encapsulated within a molded block of plastic, hereinafter referred to as a package body 104, and the gull-wing-shaped leads 102 project therefrom. The package body 104, formed from a plastic encapsulant such as epoxy, protects the integrated circuit from environmental contaminants and fixes the position of the leads 102 in relation to the integrated circuit.

Figure 2:
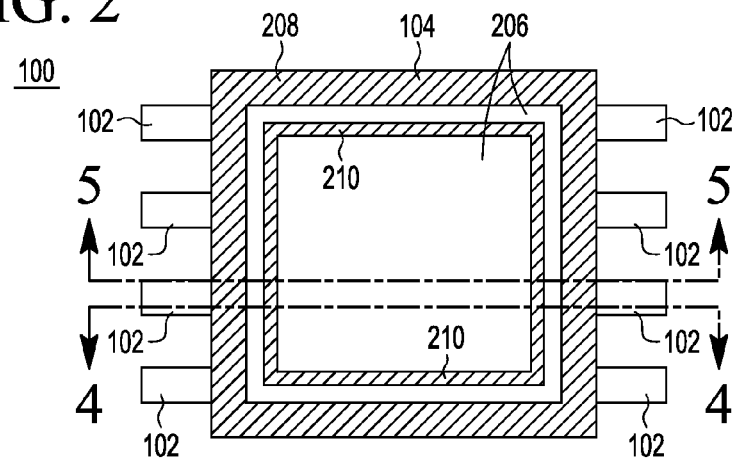
FIG. 2 is a plan view of the bottom of the integrated circuit package shown in FIG. 1.

In FIG. 2, a bottom view of the package 100 is shown. On the bottom of the package 100, an exposed metal die pad 206 is shown disposed between rows of the leads 102. This kind of package is generally referred to as an exposed pad package, specifically an EP-SOIC for the embodiment shown here. The package body 104 extends beyond edges of the die pad 206 and forms a surface 208 surrounding the die pad 206 that is substantially coplanar with the exposed surface of the die pad 206.

As will be described in more detail below, the integrated circuit within the package 100 is attached to the exposed metal die pad 206 by, for example, an adhesive layer of conventional thermally and electrically conductive epoxy, polyimide, or solder (not shown). Heat generated by the integrated circuit is coupled to the exposed metal die pad 206 by the heat-conducting adhesive layer. In a typical use of the package 100, the leads 102 and metal die pad 206 are soldered to conductors on a substantially planar printed circuit board (not shown). The conductor soldered to the metal die pad 206 is typically wider or thicker than the conductors soldered to the leads 102 to provide a low thermal resistance to heat flowing out of the package 100. Because the package is attached to a circuit board that is substantially planar, the bottoms of the leads 102 should be approximately coplanar with or slightly higher than the exposed pad 206.

In one embodiment of the invention, the exposed metal die pad 206 is secured to the package body 104 by a ring or "moat" of encapsulant 210 that is formed from the encapsulant material used to form the package body 104. As will be explained in connection with FIG. 3, under the encapsulant ring 210 is a series of openings (not shown) in a trench (not shown). Each portion of the trench has a longitudinal axis proximate and parallel to the corresponding edge of the exposed die pad 206. Before it has hardened, plastic encapsulant from the package body 104 passes through the openings and into the trench to form the encapsulant ring 210. The encapsulant ring 210, along with the encapsulant in the openings (not shown), when hardened, helps to keep the exposed die pad 206 from separating from the package body 104 during thermal cycling of the package 100. The encapsulant in the ring 210 can substantially fill the trench (not shown) but it is desirable for the exposed portion of the encapsulant ring 210 to extend no further or higher than the exposed surface of the die pad 206 to maintain planarity of the package 100.

Figure 3:
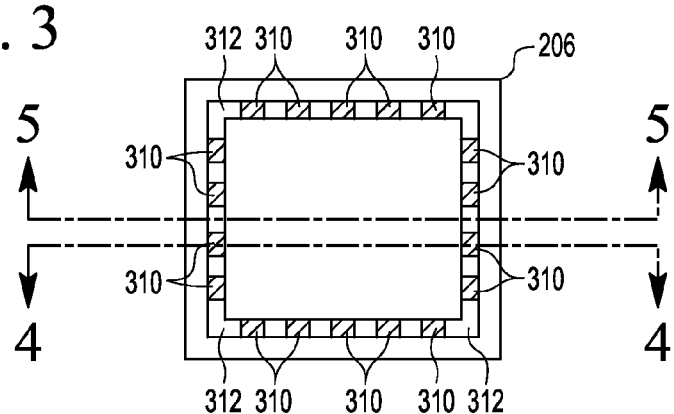
FIG. 3 is a plan view of a die pad shown in FIG. 2.

In FIG. 3, the die pad 206 is shown before the plastic encapsulant material of the package body 104 is applied. Openings 310 extend through the metal die pad 206 and are disposed in a trench 312 ringing the periphery of the die pad 206. As will be explained in more detail below, the trench 312 might be, in one embodiment, etched to a depth of between one-quarter and three-quarters of the thickness of the die pad 206. In an alternative embodiment, the trench 312 is stamped into the metal die pad 206. In either embodiment, the trench extends between the openings 310 so that the plastic from the package body 104 (before hardening) flows though the openings 310 and spreads out along the trench 312 to lock the metal die pad 206 to the package body 104. As shown here, the openings 310 and the trench 312 are proximate the edges of the metal die pad 206, i.e., adjacent to but set back from the edges of the metal die pad 206.

Alternatively, the trench 312 and the openings 310 might be disposed immediately adjacent the edges such that the edge of the metal die pad 206 is within the trench 312. Further, the trench 312 and openings 310 might not be a continuous ring but instead a discontinuous ring or one or more linear trenches, each trench having a longitudinal axis substantially parallel to and proximate an edge of the die pad 206. Still further, the trench 312 might not be disposed along the entire periphery of the die pad 206 (i.e., along all of the edges of the metal die pad 206) or along the entire length of an edge.

Each of the openings 310 is shown as a square but might have a different shape, such as a circle, oval, rectangle, triangle, etc. It is possible for different shapes and sizes of the openings 310 to be used together in one die pad 206 and spaced from each other in the same trench 312 by different distances as needed. As shown here, each opening 310 is a square having the same size as the other openings 310 and a width as measured along the longitudinal axis of the trench 312. The edge of one opening 310 is spaced from the nearest edge of an adjacent opening 310 by at least the width of the openings. The openings might be formed by etching or stamping but are usually formed using the same process used to form the trenches 312. Further, the openings 310 are usually formed before the trenches 312 are formed.

Figure 4:
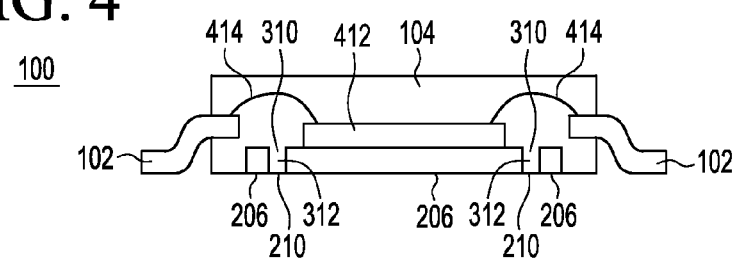
FIGS. 4 and 5 are cross-sectional side views of the package shown in FIG. 2.
Figure 5:
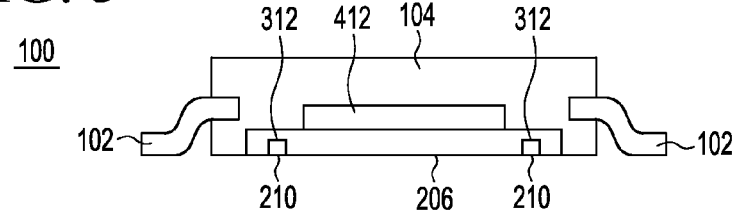

FIGS. 4 and 5 are cross-sections of the package 100 of FIG. 2 along the corresponding dashed lines to illustrate the internal structure of the package 100 and how, in one embodiment, the openings 310 and the trench 312 are configured. The cross-section view in FIG. 4 corresponds to the dashed line labeled "FIG. 4" in FIG. 2, and the cross-section view in FIG. 5 corresponds to the dashed line labeled "FIG. 5" in FIG. 2. In FIG. 4, a chip 412 is shown attached to one surface (the "chip-side" surface) of the die pad 206 using the above-mentioned adhesive layer (not shown). An opposite surface of the die pad 206 is exposed on the bottom of the package 100. Wire bonds 414 connect bond pads (not shown) on the chip 412 to the leads 102. Similarly, in FIG. 5, the chip 412 is shown attached to the die pad 206 but no wire bonds to the leads 102 are shown.

To better illustrate the structure of the die pad 206 and the trenches 312 and the openings 310 therein, the die pad 206 shown in FIG. 3 is cross-sectioned along the dashed lines labeled "FIG. 4" and "FIG. 5". The cross-section for FIG. 4 passes through the openings 310 and the trench 312, whereas the cross-section for FIG. 5 passes through only the trench 312. As illustrated in FIG. 4, the openings 310 and the trench 312 are shown filled with the plastic encapsulant from the package body 104 to form the encapsulant ring 210, whereas, in FIG. 5, the openings 310 are not shown and only the trench 312 is shown filled with the encapsulant to form the encapsulant ring 210. As shown in FIGS. 4 and 5, the exposed surface or "top" of the encapsulant ring 210 is shown coplanar with the exposed surface of the die pad 206. It is understood that the encapsulant might not fill the trench 312 such that the encapsulant ring 210 might not reach the exposed surface of the die pad 206.

Figure 6:
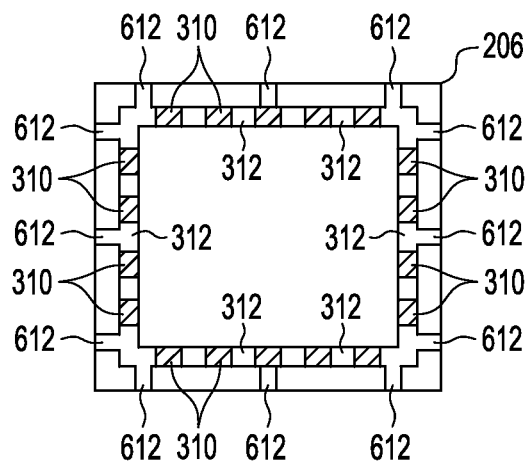
FIGS. 6 and 7 are plan views of alternative embodiments of the die pad shown in FIG. 2.

An additional feature that might be added to the above-described embodiments is shown in FIG. 6. Here, the trench 312 includes at least one extension 612 that traverses the exposed surface of the die pad 206 and extends from the trench 312 to the edge of the die pad 206 nearest the trench 312. The trench extensions 612 are shown proximate an end of the trench and a middle portion of the trench 612, although the number of extensions 612 and where to position the extensions 612 along the trench 312 are dependent on the size and shape of the trenches 312. While the extensions 612 have a width and depth substantially equal to those of the trench 312, they might be shallower or narrower than the trench 312. Because the exposed surface of the die pad 206 is typically placed on a planar substrate of an injection-molding machine used to inject the encapsulant onto the chip 412, the die pad 206, into the openings 310, and along the trench 312, the extensions 612 might be used as a path for air to escape the openings 310 and the trench 312 as they are being filled with encapsulant. The extensions 612 might also serve as an additional means for securing the die pad 206 to the package body 104.

Figure 7:
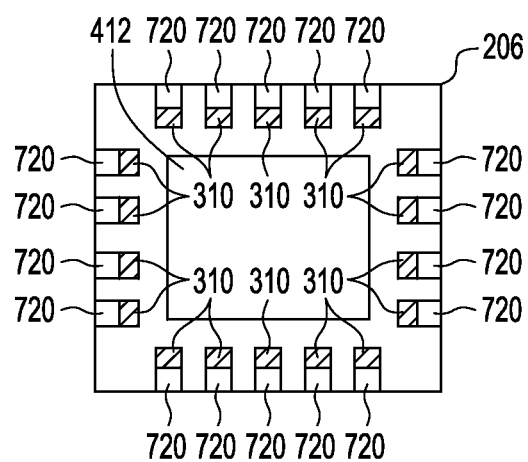

Still another additional feature that might be added to the above-described embodiments is shown in FIG. 7. On the same side of the die pad 206 as the chip 412 is mounted, one or more trenches 720 are provided disposed in the surface of the die pad 206, each trench 720 extending from a corresponding opening 310 to the edge of the die pad 206 nearest the opening 310. Like the trenches 312 on the other side of the die pad 206, the trenches 720 are typically etched into the surface of the die pad 206 and have a depth of between one-quarter and three-quarters of the thickness of the die pad 206. The additional surface area provided by the presence of the trenches 720 might serve as an additional means for securing the die pad 206 to the package body 104.

It should be understood that the steps of the exemplary method set forth herein are not necessarily required to be performed in the order described, and the order of the steps of such method should be understood to be merely exemplary. Likewise, additional steps may be included in such method, and certain steps may be omitted or combined, in such method consistent with various embodiments of the invention.

Although the invention has been described using relative terms such as "front", "back", "top", "bottom", "over", "above", "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used in the above description and claims to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

The invention claimed is:

1. An article of manufacture, comprising:
    a die pad having first and second surfaces, wherein a trench is formed in the first surface, and wherein the trench has a plurality of openings formed therein; and
    wherein the trench is proximate at least one edge of the die pad and has a longitudinal axis substantially parallel to the at least one edge of the die pad.

2. The article of manufacture of claim 1, wherein the trench has a length substantially as long as that of the at least one edge.

3. The article of manufacture of claim 1, wherein the article of manufacture is an integrated circuit package further comprising:
    an integrated circuit die attached to the second surface of the die pad; and
    an encapsulant covering the second surface of the die pad and the die;
    wherein the encapsulant extends through the openings in the die pad and at least partially fills the trench.

4. The integrated circuit package of claim 3, wherein the encapsulant extends beyond edges of the die pad and forms a surface surrounding the die pad that is substantially coplanar with the first surface of the die pad.

5. The integrated circuit package of claim 3, wherein the encapsulant substantially fills the trench to form an exposed surface that is substantially coplanar with the first surface.

6. The integrated circuit package of claim 3, further comprising:
    a plurality of leads that surround the die pad and are electrically coupled to the die, wherein a portion of each lead is embedded in the encapsulant and a remaining portion of each lead projects from and is external to the encapsulant.

7. The article of manufacture of claim 1, wherein the die pad has a thickness, the trench is etched into the first surface of the die pad, and the trench has a depth between one-quarter and three-quarters the thickness of the die pad.

8. The article of manufacture of claim 7, wherein the trench is formed after the openings are formed.

9. The article of manufacture of claim 8, wherein the trench is stamped into the first surface of the die pad.

10. The article of manufacture of claim 1, wherein the at least one edge of the die pad is within the trench.

11. The article of manufacture of claim 1, wherein the die pad has a periphery, and the trench and openings therein are disposed in the first surface and form a ring along the periphery.

12. The article of manufacture of claim 1, wherein the second surface of the die pad includes a second trench disposed between at least one of the openings and an edge of the die pad nearest the opening.

13. The article of manufacture of claim 12, wherein the second trench is etched into the second surface of the die pad and has a depth between one-quarter and three-quarters of a thickness of the die pad.

14. The article of manufacture of claim 1, wherein the trench has at least one extension that traverses the first surface from the trench to the at least one edge of the die pad nearest the trench.

15. The article of manufacture of claim 14, wherein the at least one extension is located proximate an end of the trench.

16. The article of manufacture of claim 14, wherein the at least one extension is located near a middle portion of the trench.

17. The article of manufacture of claim 14, wherein the at least one extension has a width and depth substantially equal to those of the trench.

18. The article of manufacture of claim 1, wherein the openings are square shaped with substantially equal widths, and an edge of one opening is spaced from a closest edge of an adjacent opening by an amount equal to or greater than the width of the openings.

19. The article of manufacture of claim 1, wherein the article of manufacture is a lead frame.

* * * * *